(12) United States Patent
Kinoshita et al.

(10) Patent No.: US 8,592,885 B2
(45) Date of Patent: Nov. 26, 2013

(54) NONVOLATILE SEMICONDUCTOR MEMORY DEVICE AND METHOD FOR MANUFACTURING THE SAME

(75) Inventors: Shigeru Kinoshita, Kanagawa-ken (JP); Hisataka Meguro, Mie-ken (JP); Minori Kajimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/365,470

(22) Filed: Feb. 3, 2012

(65) Prior Publication Data

US 2012/0217569 A1 Aug. 30, 2012

(30) Foreign Application Priority Data

Feb. 25, 2011 (JP) ................. 2011-039283

(51) Int. Cl.
*H01L 29/78* (2006.01)
*H01L 21/336* (2006.01)

(52) U.S. Cl.
USPC .............. 257/314; 257/E27.103; 257/E21.68; 438/257

(58) Field of Classification Search
None
See application file for complete search history.

(56) References Cited

U.S. PATENT DOCUMENTS

| | | | | |
|---|---|---|---|---|
| 5,981,404 | A * | 11/1999 | Sheng et al. | 438/791 |
| 6,228,717 | B1 * | 5/2001 | Hazama et al. | 438/265 |
| 2008/0182374 | A1 * | 7/2008 | Mori | 438/264 |
| 2010/0032687 | A1 * | 2/2010 | Calder et al. | 257/79 |
| 2010/0187593 | A1 * | 7/2010 | Morikado | 257/316 |

FOREIGN PATENT DOCUMENTS

| | | |
|---|---|---|
| JP | 2005-26590 A | 1/2005 |
| JP | 2005-322928 A | 11/2005 |
| JP | 2006-108688 A | 4/2006 |
| JP | 2008-78317 A | 4/2008 |
| JP | 2008-277694 A | 11/2008 |
| JP | 2010-283127 | 12/2010 |
| JP | 2011-14838 A | 1/2011 |
| WO | WO 2010/005878 A1 | 1/2010 |

OTHER PUBLICATIONS

Japanese Office Action issued Apr. 15, 2013, in Japan Patent Application No. 2011-039283 (with English translation).
Office Action issued Jan. 25, 2013 in Japanese Patent Application No. 2011-039283 (with English-language translation).
Korean Office Action (with English translation) issued on Jun. 18, 2013, in counterpart Korean Appln No. 10-2012-18386 (13 pages).

* cited by examiner

*Primary Examiner* — Michael Lebentritt
*Assistant Examiner* — Kevin Quinto
(74) *Attorney, Agent, or Firm* — Oblon, Spivak, McClelland, Maier & Neustadt, L.L.P.

(57) ABSTRACT

According to one embodiment, a nonvolatile semiconductor memory device includes a substrate, a tunneling insulating film, a floating gate, a leak suppression unit, an inter-gate insulating film, and a control gate. The substrate includes silicon. The tunneling insulating film is provided on the substrate. The floating gate is provided on the tunneling insulating film. The leak suppression unit is provided on the floating gate. The inter-gate insulating film is provided on the leak suppression unit. The control gate is provided on the inter-gate insulating film. The dielectric constant of the leak suppression unit is higher than a dielectric constant of the inter-gate insulating film.

17 Claims, 5 Drawing Sheets

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-039283, filed on Feb. 25, 2011; the entire contents of which are incorporated herein by reference.

FIELD

Embodiments described herein relate generally to a nonvolatile semiconductor memory device and method for manufacturing the same.

BACKGROUND

Memory cells provided in a nonvolatile semiconductor memory device such as a NAND flash memory have a stacked gate structure in which a floating gate and a control gate are stacked with an interposed inter-gate insulating film.

The width of the floating gate becomes narrow and the upper portion of the floating gate becomes sharp as downscaling progresses.

In the case where the floating gate has such a form, the electric field concentration at the upper portion of the floating gate increases and a leak (an IPD (Inter-polysilicon dielectric) leak) occurs easily between the floating gate and the control gate.

Therefore, for example, there is a risk that programming defects and the like may occur because electrons that are injected into the floating gate during the programming may undesirably be emitted from the floating gate into the control gate.

DETAILED DESCRIPTION

In general, according to one embodiment, a nonvolatile semiconductor memory device includes a substrate, a tunneling insulating film, a floating gate, a leak suppression unit, an inter-gate insulating film, and a control gate. The substrate includes silicon. The tunneling insulating film is provided on the substrate. The floating gate is provided on the tunneling insulating film. The leak suppression unit is provided on the floating gate. The inter-gate insulating film is provided on the leak suppression unit. The control gate is provided on the inter-gate insulating film. The dielectric constant of the leak suppression unit is higher than a dielectric constant of the inter-gate insulating film.

Embodiments will now be described with reference to the drawings. Similar components in the drawings are marked with like reference numerals, and a detailed description is omitted as appropriate.

First Embodiment

Figure 1:
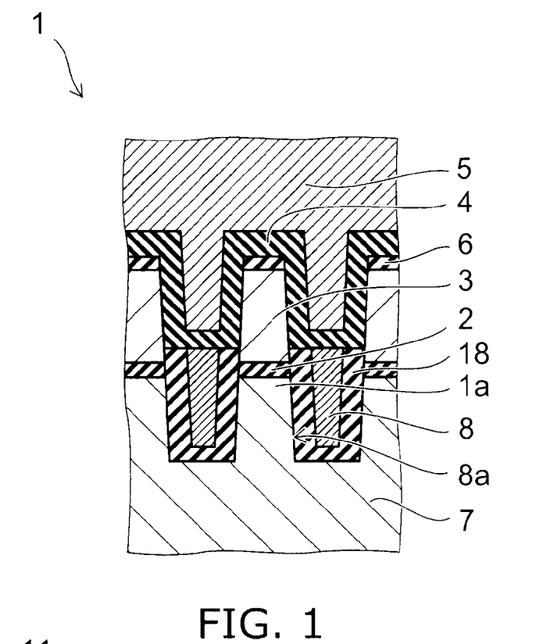
FIG. 1 is a schematic partial cross-sectional view illustrating a nonvolatile semiconductor memory device according to a first embodiment.

FIG. 1 is a schematic partial cross-sectional view illustrating a nonvolatile semiconductor memory device according to a first embodiment.

In FIG. 1, portions of a memory cell are mainly illustrated; and known word lines, bit lines, inter-layer insulating films, protective films, contacts, peripheral circuit units, etc., that are provided in the nonvolatile semiconductor memory device 1 are omitted.

Because FIG. 1 illustrates a cross section in a word line direction (a channel width direction), known source/drain regions, channel regions, etc., also are omitted.

As illustrated in FIG. 1, a tunneling insulating film 2, a floating gate 3, a leak suppression unit 6, an inter-gate insulating film 4, and a control gate 5 are stacked in this order in a portion of the memory cell of the nonvolatile semiconductor memory device 1.

This memory cell is formed in the upper layer portion of a substrate 7 that includes silicon and is provided on an active area (an element formation region, an active region) 1a with an element-separating insulating film 8 provided around the active area.

The element-separating insulating film 8 is formed by filling an insulator such as silicon oxide and the like into a trench 8a made in the substrate 7.

A protective film 18 may be provided between the trench 8a and the element-separating insulating film 8. The protective film 18 is provided so that the impurities included in the element-separating insulating film 8 do not affect the substrate 7 and the like. Therefore, the protective film 18 may include an insulator (e.g., silicon oxide, etc.) having a purity higher than that of the element-separating insulating film 8.

However, the protective film 18 is not always necessary and may be provided as necessary.

The tunneling insulating film 2 is provided on the substrate 7. In such a case, the tunneling insulating film 2 is provided on the active area 1a. The tunneling insulating film 2 may include, for example, a silicon oxide film, a silicon oxynitride film, and the like having a thickness of about 3 nm to 15 nm.

The floating gate 3 is provided on the tunneling insulating film 2. The floating gate 3 may include, for example, a polysilicon film and the like having a thickness of about 10 nm to 500 nm. In such a case, for example, phosphorus, arsenic, and the like may be doped with a concentration of about $10^{18}$ atoms/cm$^{-3}$ to $10^{21}$ atoms/cm$^{-3}$ to provide electrical conductivity.

The inter-gate insulating film 4 is provided on the leak suppression unit 6 described below. In other words, the inter-gate insulating film 4 is provided above the floating gate 3 between the floating gate 3 and the control gate 5 with the interposed leak suppression unit 6 that is described below. The inter-gate insulating film 4 is provided sideward of the floating gate 3 between the floating gate 3 and the control gate 5. The inter-gate insulating film 4 may include, for example, an insulating film having a thickness of about 5 nm to 30 nm. In such a case, the inter-gate insulating film 4 may include, for example, a silicon oxide film, a silicon oxynitride film, and the like. The inter-gate insulating film 4 may include, for example, a stacked film such as a silicon oxide film/silicon nitride film/silicon oxide film (an ONO film) and the like.

The control gate 5 is provided on the inter-gate insulating film 4. The control gate 5 may include, for example, a polysilicon film and the like having a thickness of about 10 nm to 500 nm. In such a case, for example, phosphorus, arsenic, boron, and the like may be doped with a concentration of about $10^{18}$ atoms/cm$^{-3}$ to $10^{21}$ atoms/cm$^{-3}$ to provide electrical conductivity.

Or, the control gate 5 may have a stacked structure in which a silicide film and a polysilicon film are stacked by forming a metal film such as W, Ni, Mo, Ti, Co, etc., on the formed polysilicon film and by subsequently performing heat treatment to form a silicide film.

Here, the memory cell is formed using a PEP (a Photo Engraving Process) and RIE (Reactive Ion Etching).

For example, the memory cell can be formed into the desired configuration by stacking films used to form each of the components included in the memory cell, forming a mask on the stacked films, and performing RIE.

In such a case, the width of the floating gate 3 becomes narrow as downscaling of the memory cell progresses; and the upper portion of the floating gate 3 becomes fine and sharp as illustrated in FIG. 1.

For example, the upper portion of the floating gate 3 easily becomes fine and sharp because the surfaces of the floating gate 3 also are etched when making the trench 8a for filling the element-separating insulating film 8.

In the case where the floating gate 3 has such a form, the electric field concentration increases at the upper portion of the floating gate 3 during the programming operation; and leaks (IPD leaks) occur easily between the floating gate 3 and the control gate 5.

Therefore, in the nonvolatile semiconductor memory device 1, the occurrence of leaks is suppressed by providing the leak suppression unit 6 between the floating gate 3 and the inter-gate insulating film 4.

The leak suppression unit 6 is provided on the floating gate 3. In such a case, the leak suppression unit 6 may be provided to cover the upper surface of the floating gate 3.

The dielectric constant of the leak suppression unit 6 is higher than the dielectric constant of the inter-gate insulating film 4.

For example, a silicon nitride film may be used as the leak suppression unit 6 in the case where the inter-gate insulating film 4 is a silicon oxide film or an ONO film. The leak suppression unit 6 may include a metal oxide such as aluminum oxide, hafnium oxide, etc.

In the case where a film that has a relatively low dielectric constant such as a silicon oxide film, etc., is simply provided on the upper portion of the floating gate 3, the film thickness of the leak suppression unit 6 which has a low dielectric constant is added to that of the inter-gate insulating film 4 at the upper portion of the floating gate 3; and capacitive coupling between the control gate 5 and the floating gate 3 undesirably decreases due to the increase of the total insulating film thickness.

Therefore, by the leak suppression unit 6 being a highly dielectric film, the effective film thickness of the leak suppression unit 6 added to the inter-gate insulating film 4 can be thin; and the decrease of the capacitive coupling is suppressed.

Thus, it is advantageous to provide a leak suppression unit 6 that has a dielectric constant higher than that of the inter-gate insulating film 4 when the floating gate 3 and the control gate 5 are capacitively coupled.

Generally, the sharpness of the upper portion of the floating gate 3 can be suppressed by providing the leak suppression unit 6 having the high dielectric constant at the upper portion of the floating gate 3 because a film that includes a material having a high dielectric constant is not etched easily.

Further, by stacking from the floating gate 3 side the leak suppression unit 6 having the high dielectric constant and an inter-gate insulating film 4 having a dielectric constant lower than that of the leak suppression unit 6, the electric field strength on the leak suppression unit 6 side with the high dielectric constant can be weaker.

In other words, the electric field strength of the film having the high dielectric constant is weaker in the case where a film having a low dielectric constant is stacked with the film having a high dielectric constant. Therefore, the electric field strength of the upper portion of the floating gate 3 can be weaker by providing the film (the leak suppression unit 6) having the high dielectric constant for which the electric field strength is weaker on the floating gate 3 side.

Thus, the occurrence of leaks can be suppressed by providing the leak suppression unit 6 that has a dielectric constant higher than that of the inter-gate insulating film 4.

Second Embodiment

Figure 2:
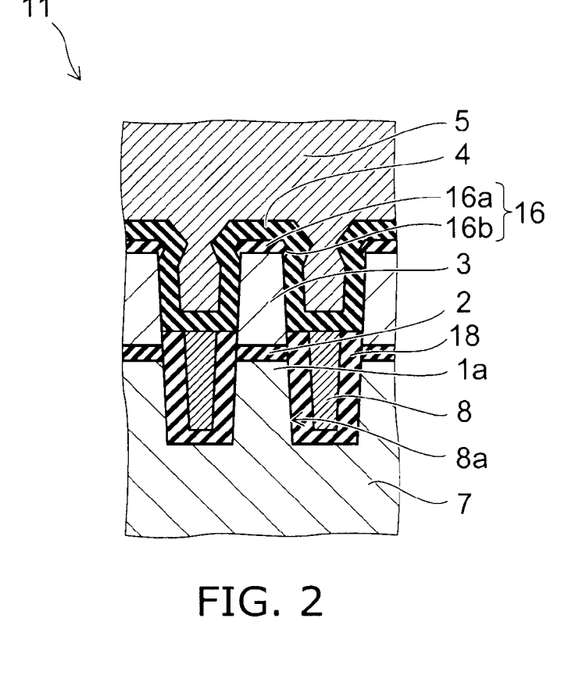
FIG. 2 is a schematic partial cross-sectional view illustrating a nonvolatile semiconductor memory device according to a second embodiment.

FIG. 2 is a schematic partial cross-sectional view illustrating a nonvolatile semiconductor memory device according to a second embodiment.

As illustrated in FIG. 2, the tunneling insulating film 2, the floating gate 3, a leak suppression unit 16, the inter-gate insulating film 4, and the control gate 5 are stacked in this order in the portion of the memory cell of the nonvolatile semiconductor memory device 11.

The leak suppression unit 16 may have a dielectric constant higher than that of the inter-gate insulating film 4.

For example, a silicon nitride film may be used as the leak suppression unit 16 in the case where a silicon oxide film or an ONO film is used as the inter-gate insulating film 4. The leak suppression unit 16 may include a metal oxide such as aluminum oxide, hafnium oxide, etc.

Here, the leak suppression unit 16 is provided also to cover the upper end proximity of the side wall of the floating gate 3 by extending beyond a portion where the upper surface of the floating gate 3 meets the floating gate 3 side wall.

In other words, the leak suppression unit 16 has a main body portion 16a (the portion corresponding to the leak suppression unit 6 described above) and a side portion 16b that covers the upper end proximity of the side wall of the floating gate 3 by extending beyond the portion where the upper surface meets the side wall of the floating gate 3.

The material properties of the main body portion 16a may be the same as or different from the material properties of the side portion 16b.

In such a case, as illustrated in FIG. 2, in the case where a corner is formed at the circumferential edge of the upper surface of the floating gate 3, the leak suppression unit 16 may be provided also to cover the upper end proximity of the side wall by extending beyond the corner. The corner is not limited to being sharp and may be, for example, rounded.

In the case where the leak suppression unit 16 covers the entire floating gate 3 side wall, there is a risk that the parasitic capacitance between adjacent memory cells may increase because the effective dielectric constant of the insulating film sideward of the floating gate 3 undesirably increases.

Therefore, at the floating gate 3 side wall, it is favorable for the leak suppression unit 16 to be enough to cover the upper end proximity of the side wall.

By providing the leak suppression unit 16, effects similar to those of the leak suppression unit 6 described above can be provided.

Here, there are cases where the portion where the upper surface meets the side wall of the floating gate 3 is a sharp corner; and there is a risk that the electric field concentration at this portion may increase further.

However, the occurrence of leaks can be suppressed even in the case where the sharp corner is formed because the leak suppression unit 16 is provided also to cover this portion.

Third Embodiment

FIGS. 3A to 3C and FIGS. 4A to 4C are schematic cross-sectional views of processes, illustrating the method for manufacturing the nonvolatile semiconductor memory device according to a third embodiment.

FIGS. 3A to 3C and FIGS. 4A to 4C are the case where the nonvolatile semiconductor memory device 1 described above is manufactured. FIGS. 3A to 3C and FIGS. 4A to 4C illustrate cross sections in the word line direction (the channel width direction).

Although source/drain regions, active areas, word lines, bit lines, inter-layer insulating films, protective films, contacts, peripheral circuits, etc., also are formed in the manufacturing of the nonvolatile semiconductor memory device 1, known technology may be applied in their formation.

Therefore, herein, a description thereof is omitted; and the formation of a portion of the memory cell is mainly illustrated.

Figure 3A:
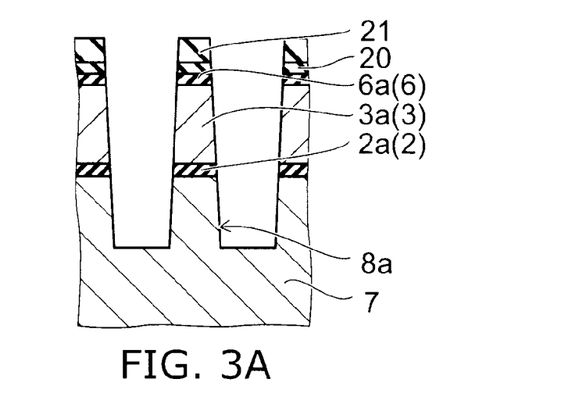
FIGS. 3A to 3C and FIGS. 4A to 4C are schematic cross-sectional views of processes, illustrating the method for manufacturing the nonvolatile semiconductor memory device according to a third embodiment.

First, a film 2a used to form the tunneling insulating film 2 is formed on the substrate 7 that includes silicon and is doped with the desired impurity.

The formation of the film 2a used to form the tunneling insulating film 2 may be performed using, for example, thermal oxidation and the like.

The film 2a used to form the tunneling insulating film 2 may include, for example, a silicon oxide film, a silicon oxynitride film, and the like having a thickness of about 3 nm to 15 nm.

Then, a film 3a used to form the floating gate 3 is formed on the film 2a used to form the tunneling insulating film 2. The formation of the film 3a used to form the floating gate 3 may be performed using, for example, LPCVD (Low Pressure Chemical Vapor Deposition) and the like.

The film 3a used to form the floating gate 3 may include, for example, a polysilicon film and the like having a thickness of about 10 nm to 500 nm.

In such a case, for example, phosphorus, arsenic, and the like may be doped with a concentration of about $10^{18}$ atoms/$cm^{-3}$ to $10^{21}$ atoms/$cm^{-3}$ to provide electrical conductivity.

The desired annealing may be performed after the film 3a used to form the floating gate 3 is formed.

Then, a film 6a used to form the leak suppression unit 6 is formed on the film 3a used to form the floating gate 3.

The formation of the film 6a used to form the leak suppression unit 6 may be performed using, for example, CVD (Chemical Vapor Deposition) and the like.

Here, a film having a dielectric constant higher than the dielectric constant of a film 4a used to form the inter-gate insulating film 4 is formed when forming the film 6a used to form the leak suppression unit 6.

In the case where the film 4a used to form the inter-gate insulating film 4 is a silicon oxide film or an ONO film, the film 6a used to form the leak suppression unit 6 may be, for example, a silicon nitride film or a film including a metal oxide such as aluminum oxide, hafnium oxide, etc.

Then, the leak suppression unit 6, the floating gate 3, and the tunneling insulating film 2 are formed in a prescribed configuration while making the trench 8a for filling the element-separating insulating film 8 by sequentially etching the film 6a used to form the leak suppression unit 6, the film 3a used to form the floating gate 3, and the film 2a used to form the tunneling insulating film 2.

For example, as illustrated in FIG. 3A, a stopper film 20 and a mask 21 are formed sequentially on the film 6a used to form the leak suppression unit 6. Then, the trench 8a is made into the desired configuration by sequentially patterning the stopper film 20, the film 6a, the film 3a, the film 2a, and the substrate 7 by RIE using the mask 21 as an etching mask. At this time, the trench 8a is made and the leak suppression unit 6, the floating gate 3, and the tunneling insulating film 2 are formed.

The mask 21 may be, for example, a patterned silicon oxide film.

In such a case, the mask 21 may be patterned using a not-illustrated resist mask provided on the film used to form the mask 21.

Figure 3B:
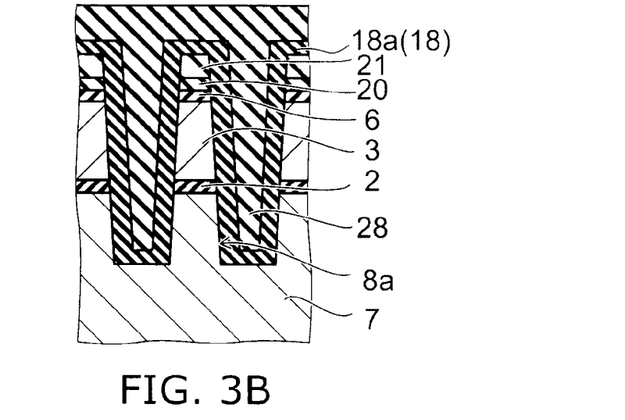

Then, a film 18a used to form the protective film 18 is formed; and the element-separating insulating film 8 is filled into the trench 8a.

As illustrated in FIG. 3B, for example, the film 18a is formed with fewer impurities than those of the element-separating insulating film 8. Then, the interior of the trench 8a is filled by using, for example, a TEOS (Tetra Ethyl Ortho Silicate) film and the like to deposit a film 28 in the trench 8a.

In such a case, for example, the film 28 may be deposited in the interior of the trench 8a using plasma CVD and the like.

Figure 3C:
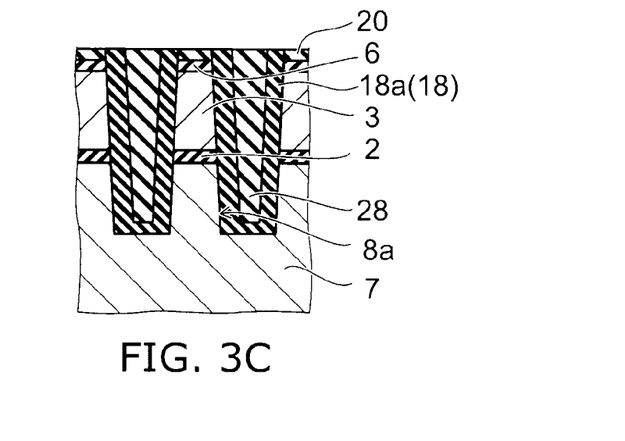

Then, as illustrated in FIG. 3C, the entire front surface is planarized by CMP (Chemical Mechanical Polishing) using the stopper film 20 as a stopper.

Figure 4A:
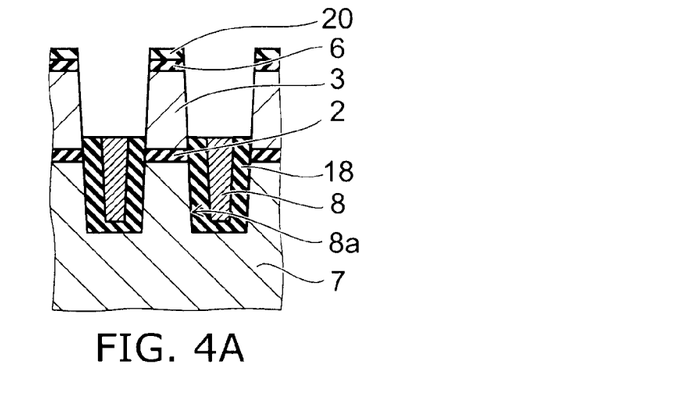

Continuing as illustrated in FIG. 4A, the element-separating insulating film 8 and the protective film 18 are formed in a STI (Shallow trench Isolation) structure by causing the upper surfaces of the film 18a and the film 28 to recede by wet etching or dry etching using the stopper film 20 as a mask.

Thus, the element-separating insulating film 8 is filled into the trench 8a. The protective film 18 is formed between the trench 8a and the element-separating insulating film 8.

Figure 4B:
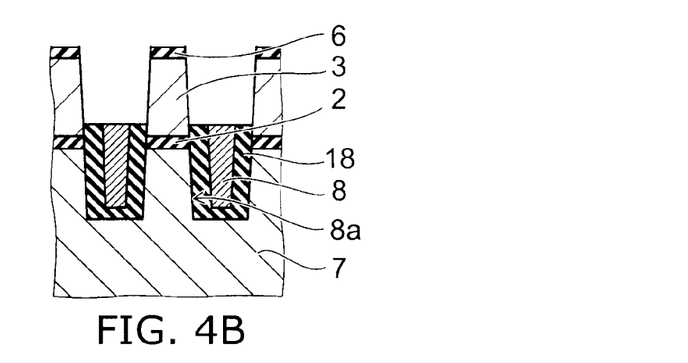

Subsequently, as illustrated in FIG. 4B, the stopper film 20 is removed using wet etching and the like.

DHF (Dilute HF, Dilute Hydrofluoric Acid) may be used as a wet etchant in the wet etching. RIE and the like may be used as the dry etching.

Figure 4C:
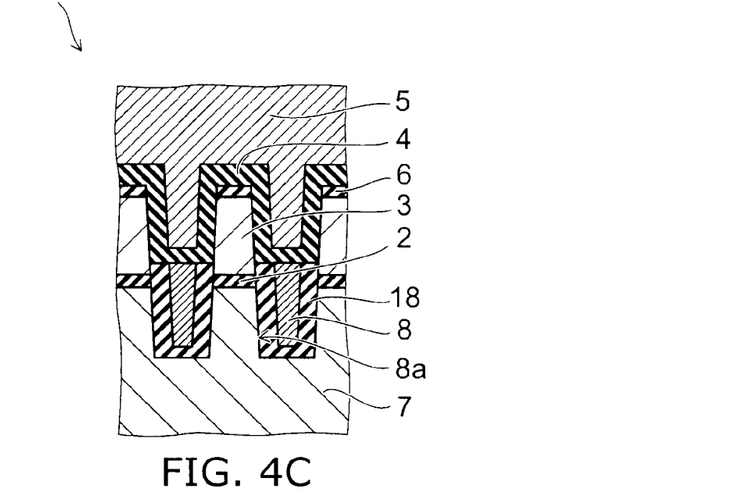

Then, as illustrated in FIG. 4C, a film used to form the inter-gate insulating film 4 and a film used to form the control gate 5 are formed sequentially.

The formation of the film used to form the inter-gate insulating film 4 may be performed using, for example, LPCVD and the like.

The film used to form the inter-gate insulating film 4 may include, for example, a silicon oxide film, a silicon oxynitride film, an ONO film, and the like having a thickness of about 5 nm to 30 nm.

The formation of the film used to form the control gate 5 may be performed using, for example, LPCVD.

The film used to form the control gate 5 may include, for example, a polysilicon film having a thickness of about 10 nm to 500 nm.

In such a case, for example, phosphorus, arsenic, boron, and the like may be doped with a concentration of about $10^{18}$ atoms/$cm^{-3}$ to $10^{21}$ atoms/$cm^{-3}$ to provide electrical conductivity.

Then, the control gate 5 and the inter-gate insulating film 4 are formed in the prescribed configuration by sequentially etching the film used to form the control gate 5 and the film used to form the inter-gate insulating film 4.

The etching of the film used to form the control gate 5 and the film used to form the inter-gate insulating film 4 may be performed using, for example, RIE.

Thus, the nonvolatile semiconductor memory device 1 including the leak suppression unit 6 can be manufactured.

Fourth Embodiment

FIGS. 5A to 5C and FIGS. 6A to 6C are schematic cross-sectional views of processes, illustrating a method for manufacturing a nonvolatile semiconductor memory device according to a fourth embodiment.

FIGS. 5A to 5C and FIGS. 6A to 6C are the case where the nonvolatile semiconductor memory device 11 described above is manufactured. FIGS. 5A to 5C and FIGS. 6A to 6C illustrate cross sections in the word line direction (the channel width direction).

Similar to the description recited above, the formation of the source/drain regions, the active areas, the word lines, the bit lines, the inter-layer insulating films, the protective films, the contacts, the peripheral circuits, etc., is omitted; and the formation of a portion of the memory cell is mainly illustrated.

Components similar to those illustrated in FIGS. 3A to 3C and FIGS. 4A to 4C are omitted as appropriate.

Figure 5A:
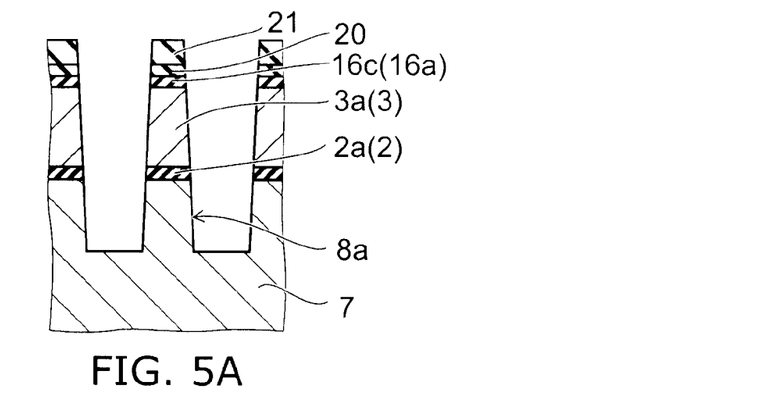
FIGS. 5A to 5C and FIGS. 6A to 6C are schematic cross-sectional views of processes, illustrating a method for manufacturing a nonvolatile semiconductor memory device according to a fourth embodiment.

First, as illustrated in FIG. 5A, the film 2a used to form the tunneling insulating film 2, the film 3a used to form the floating gate 3, a film 16c used to form the main body portion 16a of the leak suppression unit 16, the stopper film 20, and the mask 21 are formed sequentially on the substrate 7, which includes silicon and is doped with the desired impurity.

Then, the main body portion 16a of the leak suppression unit 16, the floating gate 3, and the tunneling insulating film 2 are formed in the prescribed configuration while making the trench 8a for filling the element-separating insulating film 8 by sequentially etching the stopper film 20, the film 16c used to form the main body portion 16a of the leak suppression unit 16, the film 3a used to form the floating gate 3, the film 2a used to form the tunneling insulating film 2, and the substrate 7.

The etching may be performed by RIE using the mask 21 as an etching mask.

In such a case, the formation of the film 16c used to form the main body portion 16a of the leak suppression unit 16 may be performed using, for example, CVD (Chemical Vapor Deposition) and the like.

Figure 5B:
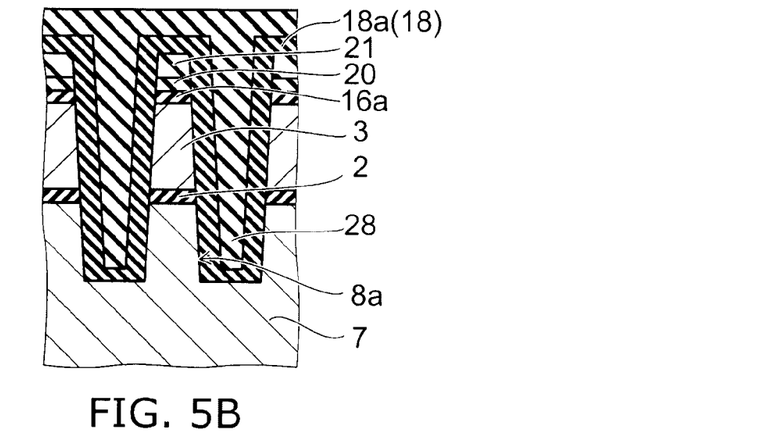

Then, as illustrated in FIG. 5B, the film 18a used to form the protective film 18 is formed; and the film 28 used to form the element-separating insulating film 8 is formed in the interior of the trench 8a.

The film 28 may include, for example, a TEOS (Tetra Ethyl Ortho Silicate) film and the like.

Figure 5C:
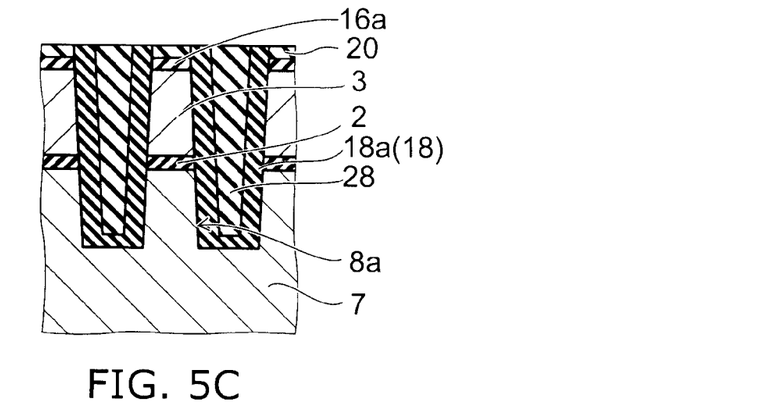

Then, as illustrated in FIG. 5C, the entire front surface is planarized by CMP (Chemical Mechanical Polishing) using the stopper film 20 as a stopper.

Continuing similarly to the case of FIG. 4A, the element-separating insulating film 8 and the protective film 18 are formed in an STI structure by causing the upper surfaces of the film 18a and the film 28 to recede by wet etching or dry etching using the stopper film 20 as a mask.

Subsequently, similarly to the case of FIG. 4B, the stopper film 20 is removed using wet etching and the like.

Figure 6A:
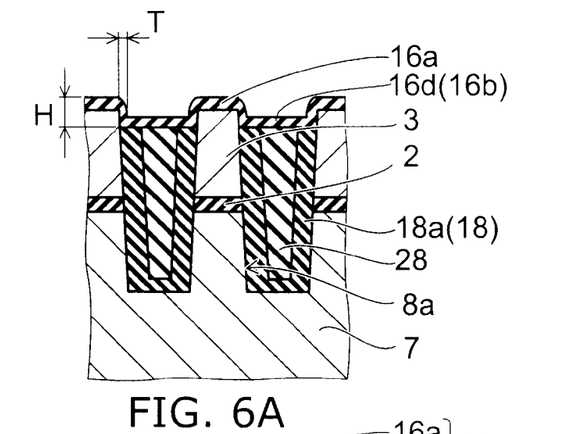

Then, as illustrated in FIG. 6A, a film 16d used to form the side portion 16b of the leak suppression unit 16 is formed on the upper surfaces of the film 28 and the film 18a and on the side wall of the trench 8a.

In such a case, a receded dimension H of the film 28 and the film 18a and a thickness T of the film 16d can be appropriately set by considering the dimension of the side portion 16b of the leak suppression unit 16.

A film having a dielectric constant higher than the dielectric constant of the film 4a used to form the inter-gate insulating film 4 is formed when forming the film 16c used to form the main body portion 16a of the leak suppression unit 16 and the film 16d used to form the side portion 16b of the leak suppression unit 16.

In the case where the film 4a used to form the inter-gate insulating film 4 is a silicon oxide film or an ONO film, the film 16c and the film 16d may include, for example, a silicon nitride film or a film including a metal oxide such as aluminum oxide, hafnium oxide, etc.

In such a case, the material properties of the film 16c and the film 16d may be the same or may be different.

The material properties of the film 16d can be selected by considering the selectivity when removing the film 28 and the film 18a by etching.

Figure 6B:
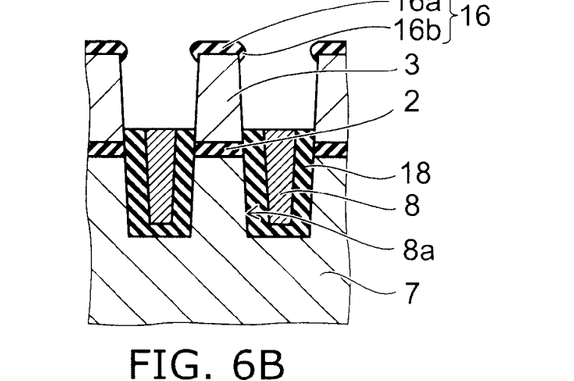

Then, as illustrated in FIG. 6B, the leak suppression unit 16 which has the main body portion 16a and the side portion 16b is formed by removing the film 16d used to form the side portion 16b of the leak suppression unit 16 that was formed on the upper surfaces of the film 28 and the film 18a.

The removal of the film 16d formed on the upper surfaces of the film 28 and the film 18a may be performed using, for example, RIE.

The element-separating insulating film 8 is formed in an STI structure by causing the upper surfaces of the film 28 and the film 18a to recede by a prescribed dimension. At this time, the protective film 18 is formed between the trench 8a and the element-separating insulating film 8. Isotropic etching such as wet etching and the like may be performed when causing the upper surfaces of the film 28 and the film 18a to recede.

Figure 6C:
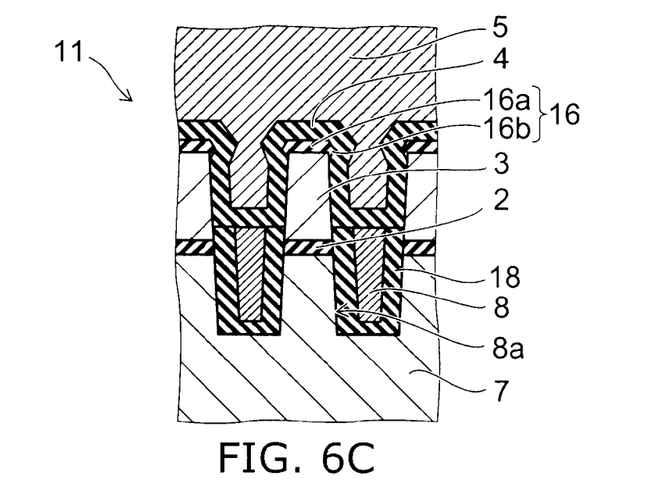

Then, as illustrated in FIG. 6C, the film used to form the inter-gate insulating film 4 and the film used to form the control gate 5 are formed sequentially on the front surface.

Continuing, the control gate 5 and the inter-gate insulating film 4 are formed in the prescribed configuration by sequentially etching the film used to form the control gate 5 and the film used to form the inter-gate insulating film 4.

Thus, the nonvolatile semiconductor memory device 11 including the leak suppression unit 16 can be manufactured.

Although the stopper film 20 is provided separately on the film used to form the leak suppression unit in the method for manufacturing the nonvolatile semiconductor memory device illustrated above, the stopper film 20 may be provided as necessary.

For example, in the case where the film used to form the leak suppression unit is a silicon nitride film, it is unnecessary to separately provide the stopper film 20 because the film used to form the leak suppression unit also can perform the role of the stopper film 20.

Thus, it is unnecessary to provide the separate processes relating to the formation and the removal of the stopper film 20.

According to the embodiments described above, a nonvolatile semiconductor memory device and a method for manufacturing the same can be realized in which leaks between the floating gate and the control gate are suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For example, the configurations, the dimensions, the material properties, the dispositions, the numbers, etc., of the components included in the nonvolatile semiconductor memory device 1, the nonvolatile semiconductor memory device 11, and the like are not limited to those illustrated and may be modified appropriately.

What is claimed is:

1. A nonvolatile semiconductor memory device, comprising:
    a substrate including silicon and having an active area and an element-separating insulating film provided around the active area;
    a tunneling insulating film provided on the active area;
    a floating gate provided on the tunneling insulating film;
    a leak suppression unit provided on the floating gate;
    an inter-gate insulating film provided on the leak suppression unit; and
    a control gate provided on the inter-gate insulating film,
    the leak suppression unit provided to cover an upper surface of the floating gate and an upper portion of a side wall of the floating gate by extending beyond a corner formed by an upper surface of the floating gate meeting the side wall of the floating gate, and being provided apart from the element-separating insulating film, and
    a dielectric constant of the leak suppression unit being higher than a dielectric constant of the inter-gate insulating film.

2. The device according to claim 1, wherein an electric field strength of the leak suppression unit is lower than an electric field strength of the inter-gate insulating film.

3. The device according to claim 1, wherein a width dimension of an upper portion of the floating gate is narrower than a width dimension of a lower portion of the floating gate.

4. The device according to claim 1, wherein the corner is sharp.

5. The device according to claim 1, wherein the corner is rounded.

6. The device according to claim 1, wherein the leak suppression unit includes at least one selected from silicon nitride and metal oxide.

7. The device according to claim 6, wherein the metal oxide is at least one selected from aluminum oxide and hafnium oxide.

8. A method for manufacturing a nonvolatile semiconductor memory device, comprising:
    sequentially forming a film used to form a tunneling insulating film, a film used to form a floating gate, and a film used to form a leak suppression unit on a substrate including silicon;
    forming the leak suppression unit, the floating gate, and the tunneling insulating film in a prescribed configuration while making a trench by sequentially etching the film used to form the leak suppression unit, the film used to form the floating gate, and the film used to form the tunneling insulating film, the trench being used to fill an element-separating insulating film;
    filling the element-separating insulating film into the trench;
    sequentially forming a film used to form an inter-gate insulating film and a film used to form a control gate; and
    forming the control gate and the inter-gate insulating film in a prescribed configuration by sequentially etching the film used to form the control gate and the film used to form the inter-gate insulating film,
    the forming of the film used to form the leak suppression unit including forming a film having a dielectric constant higher than a dielectric constant of the film used to form the inter-gate insulating film.

9. The method according to claim 8, wherein the forming of the leak suppression unit and the floating gate includes the leak suppression unit being provided to cover an upper surface of the floating gate.

10. The method according to claim 8, wherein a width dimension of an upper portion of the floating gate becomes narrower than a width dimension of a lower portion of the floating gate in the forming of the floating gate.

11. The method according to claim 8, wherein the film used to form the leak suppression unit includes at least one selected from silicon nitride and metal oxide.

12. The method according to claim 11, wherein the metal oxide is at least one selected from aluminum oxide and hafnium oxide.

13. A method for manufacturing a nonvolatile semiconductor memory device, comprising:
    sequentially forming a film used to form a tunneling insulating film, a film used to form a floating gate, and a film used to form a main body portion of a leak suppression unit on a substrate including silicon;
    forming the main body portion of the leak suppression unit, the floating gate, and the tunneling insulating film in a prescribed configuration while making a trench by sequentially etching the film used to form the main body portion of the leak suppression unit, the film used to form the floating gate, and the film used to form the tunneling insulating film, the trench being used to fill an element-separating insulating film;
    forming a film used to form the element-separating insulating film in an interior of the trench;
    causing an upper surface of the film used to form the element-separating insulating film to recede by a prescribed dimension;
    forming a film used to form a side portion of the leak suppression unit on the upper surface of the film used to form the element-separating insulating film and on a side wall of the trench;
    forming the leak suppression unit to have the main body portion and the side portion by removing the film used to form the side portion of the leak suppression unit formed on the upper surface of the film used to form the element-separating insulating film;
    forming the element-separating insulating film by causing the upper surface of the film used to form the element-separating insulating film to recede by a prescribed dimension;
    sequentially forming a film used to form an inter-gate insulating film and a film used to form a control gate; and
    forming the control gate and the inter-gate insulating film in a prescribed configuration by sequentially etching the film used to form the control gate and the film used to form the inter-gate insulating film,
    the forming of the film used to form the main body portion of the leak suppression unit and the film used to form the side portion of the leak suppression unit including forming a film having a dielectric constant higher than a dielectric constant of the film used to form the inter-gate insulating film.

14. The method according to claim 13, wherein the forming of the leak suppression unit having the main body portion and the side portion includes the leak suppression unit being provided to extend beyond a portion formed by an upper surface of the floating gate meeting a side wall of the floating gate.

15. The method according to claim 13, wherein a width dimension of an upper portion of the floating gate becomes narrower than a width dimension of a lower portion of the floating gate in the forming of the floating gate.

16. The method according to claim 13, wherein the film used to form the leak suppression unit includes at least one selected from silicon nitride and metal oxide.

17. The method according to claim 16, wherein the metal oxide is at least one selected from aluminum oxide and hafnium oxide.

* * * * *